United States Patent
Hsu et al.

(10) Patent No.: US 9,576,517 B2
(45) Date of Patent: Feb. 21, 2017

(54) SHIFT REGISTER

(71) Applicant: AU Optronics Corp., Hsin-Chu (TW)

(72) Inventors: Wei-Chu Hsu, Hsin-Chu (TW);
Man-Wen Shih, Hsin-Chu (TW);
Ya-Ling Chen, Hsin-Chu (TW);
Chien-Ya Lee, Hsin-Chu (TW)

(73) Assignee: AU OPTRONICS CORP., Hsin-chu (TW)

( * ) Notice: Subject to any disclaimer, the term of this patent is extended or adjusted under 35 U.S.C. 154(b) by 138 days.

(21) Appl. No.: 14/583,597

(22) Filed: Dec. 27, 2014

(65) Prior Publication Data

US 2016/0049107 A1 Feb. 18, 2016

(30) Foreign Application Priority Data

Aug. 15, 2014 (TW) .............................. 103128141 A

(51) Int. Cl.
*G11C 19/00* (2006.01)
*G09G 3/20* (2006.01)
*G11C 19/28* (2006.01)

(52) U.S. Cl.
CPC ........ *G09G 3/20* (2013.01); *G09G 2310/0267* (2013.01); *G09G 2310/0286* (2013.01); *G11C 19/28* (2013.01)

(58) Field of Classification Search
None
See application file for complete search history.

(56) References Cited

U.S. PATENT DOCUMENTS

| 7,460,634 | B2 | 12/2008 | Deane | |
|---|---|---|---|---|
| 8,049,706 | B2 | 11/2011 | Tsou | |
| 2009/0115792 | A1* | 5/2009 | Otose | G11C 19/28 345/559 |
| 2010/0182227 | A1* | 7/2010 | Tsou | G09G 3/3677 345/100 |
| 2011/0134107 | A1* | 6/2011 | Lebrun | G11C 19/28 345/213 |
| 2012/0105393 | A1* | 5/2012 | Tan | G09G 3/3677 345/204 |
| 2013/0076808 | A1* | 3/2013 | Zhang | G09G 3/3677 345/694 |

(Continued)

FOREIGN PATENT DOCUMENTS

TW 201028978 A1 8/2010

*Primary Examiner* — Tuan T Lam
(74) *Attorney, Agent, or Firm* — Locke Lord LLP; Tim Tingkang Xia, Esq.

(57) ABSTRACT

A shift register includes a plurality of shift register circuits. Each of the shift register circuits includes a first switch, an input circuit, a pull-down circuit and a ripple reduction circuit. The first switch is used to output a scanning signal of the shift register circuit according to voltage levels of a node and a clock signal. The input circuit is used to pull up the voltage level of the node according to a scanning signal of a previous shift register circuit. The pull-down circuit is used to pull down the voltage levels of the node and the scanning signal of the shift register circuit according to a scanning signal of a following shift register circuit. The ripple reduction circuit is used to suppress ripples on the voltage levels of the node and the scanning signal caused by the coupling effect of the clock signal.

16 Claims, 6 Drawing Sheets

(56) References Cited

U.S. PATENT DOCUMENTS

| | | | |
|---|---|---|---|
| 2013/0272487 A1* | 10/2013 | Tobita | G09G 3/3677 377/79 |
| 2014/0056399 A1* | 2/2014 | Shang | G11C 19/28 377/68 |
| 2014/0098013 A1* | 4/2014 | Chen | G09G 3/3677 345/92 |
| 2014/0133621 A1* | 5/2014 | Shang | G11C 19/28 377/67 |

\* cited by examiner

SHIFT REGISTER

BACKGROUND

1. Technical Field

The present disclosure relates to a shift register, and more particularly, to a shift register that is able to suppress ripples.

2. Background of the Disclosure

Generally, a display panel includes a plurality of pixels, a gate driving circuit, and a source driving circuit. The gate driving circuit includes a plurality of stages of shift register circuit and is used to provide a plurality of gate driving signals for turning on and off the pixels. The source driving circuit is used to write the data signal into the turned-on pixels. The shift register is a circuit commonly used for implementing the function of the gate driving circuit. The shift register can include a plurality of stages of shift register circuit and each stage of shift register circuit is used to provide the scan signal for turning on and off a row of pixels according to the corresponding clock signal.

FIG. 1 shows a shift register circuit 100 according to related art. Each the shift register circuit 100 includes a first switch T1 for outputting the scan signal $G_N$. The first switch has a first terminal for receiving the clock signal CK, a second terminal for outputting the scan signal $G_N$ of the shift register circuit 100, and a control terminal for receiving an internal reference voltage $V_Q$, wherein the second terminal is also connected to next one shift register circuit (or namely neighbor shift register circuit) 100. When the internal reference voltage $V_Q$ and the clock signal are of high voltage level, the shift register circuit 100 can output the scan signal $G_N$ with high voltage level correspondingly. However, since the clock signal CK switches between high voltage level and low voltage level periodically, the shift register circuit 100 may induce ripples on the internal reference voltage $V_Q$ due to the coupling effect on the first switch T1 caused by the clock signal CK when the clock signal changes from low voltage level to high voltage level even when the internal reference voltage $V_Q$ should be of low voltage level, which may further cause wrong operations of the scan signal and wrong charging of the display panel.

As the resolution of the display panel becomes higher and higher, the time for the source driver to transmit a bit of pixel information is also shortened. Therefore, how to reduce the ripples caused by the clock signal on the shift register circuit instantly and effectively has become a critical issue to be solved.

SUMMARY

One embodiment of the present disclosure discloses a shift register. The shift register comprises a plurality of stages of shift register circuit. Each stage of shift register circuit comprises a first switch, and input circuit, a pull-down circuit and a ripple reduction circuit. The first switch has a first terminal for receiving a first clock signal, a second terminal for outputting a scan signal of a current stage of shift register circuit, and a control terminal electrically coupled to a node of the current stage of shift register circuit. The input circuit is used for pulling up a voltage level of the node of the shift register circuit according to a scan signal of a shift register circuit that is one stage before the current stage of shift register circuit. The pull-down circuit is electrically coupled to a second system voltage terminal, the node of the current stage of shift register circuit, and the second terminal of the first switch for pulling down the voltage level of the node of the current stage of shift register circuit and a voltage level of the second terminal of the first switch according to a scan signal of a shift register circuit that is one stage after the current stage of shift register circuit. The ripple reducing circuit is electrically coupled to the node of the current stage of shift register circuit and a first system voltage terminal for receiving a second clock signal and suppressing ripples on the node of the current stage of shift register circuit and ripples on the scan signal of the current stage of shift register circuit caused by the first clock coupling. The first clock signal and the second clock signal have a same period but opposite phases.

According to the embodiment of the present disclosure, the ripple reduction circuit of the shift register circuit can protect the first switch from turning on mistakenly due to the ripples when the clock signal changes, and thus can preserve the correctness of waveform of the scan signal avoiding the wrong charging of the display panel.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
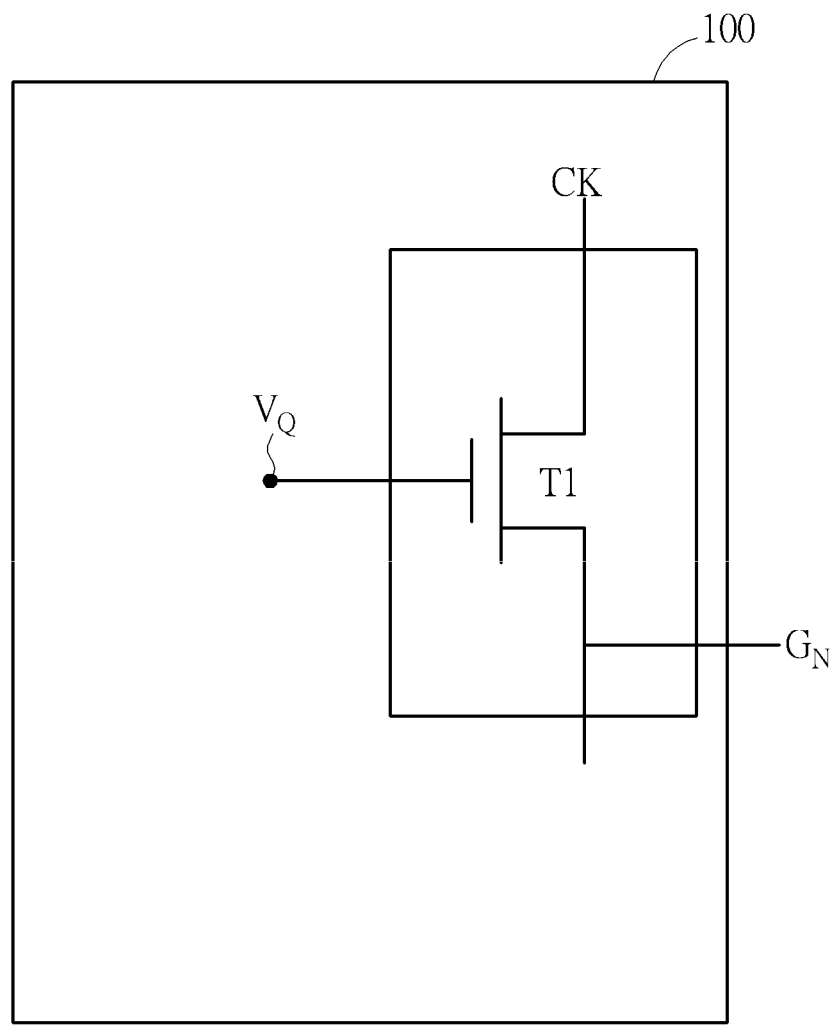
FIG. 1 shows a shift register circuit according to the related art.
Figure 2:
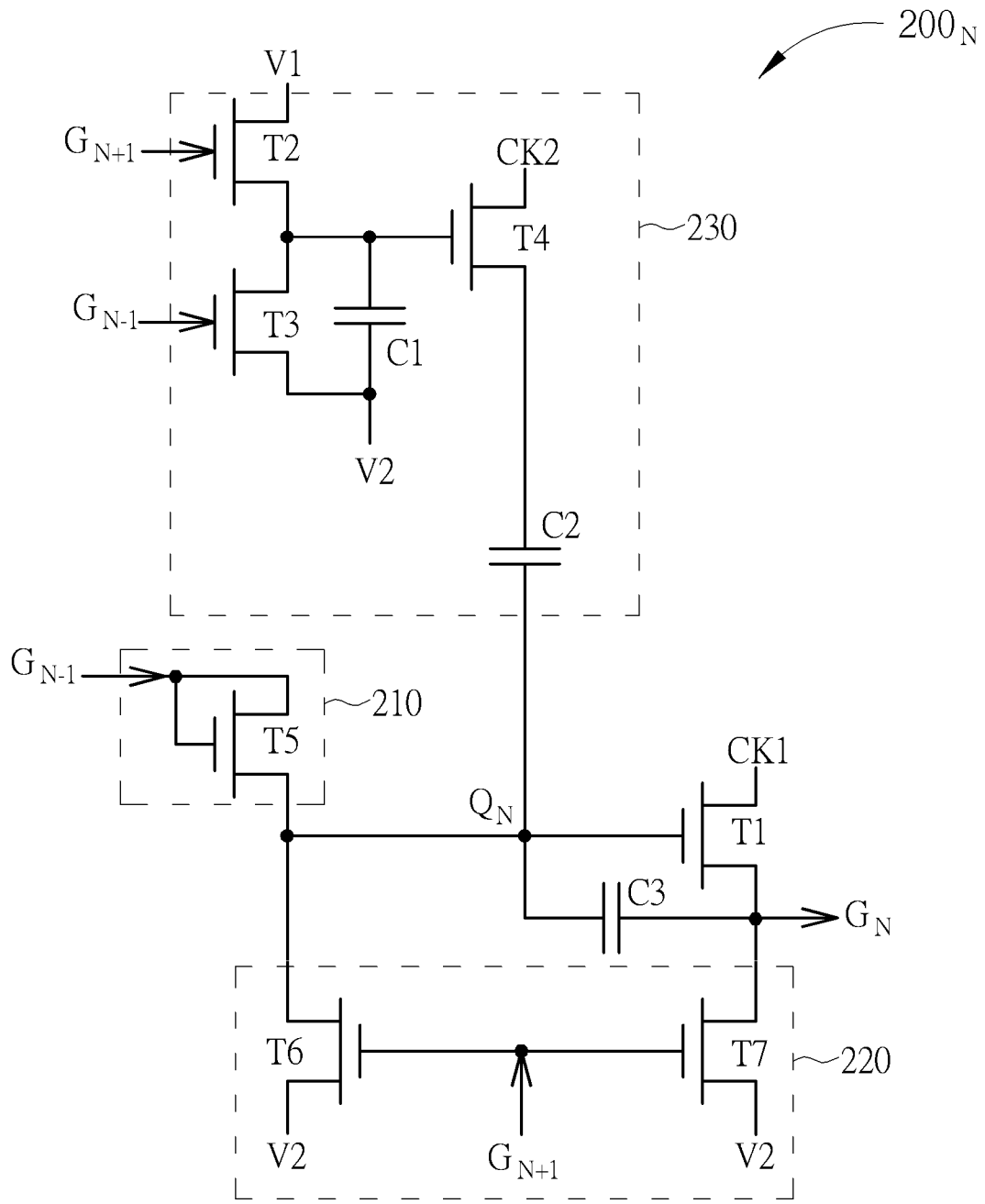
FIG. 2 shows a shift register circuit according to one embodiment of the present disclosure.
Figure 3:
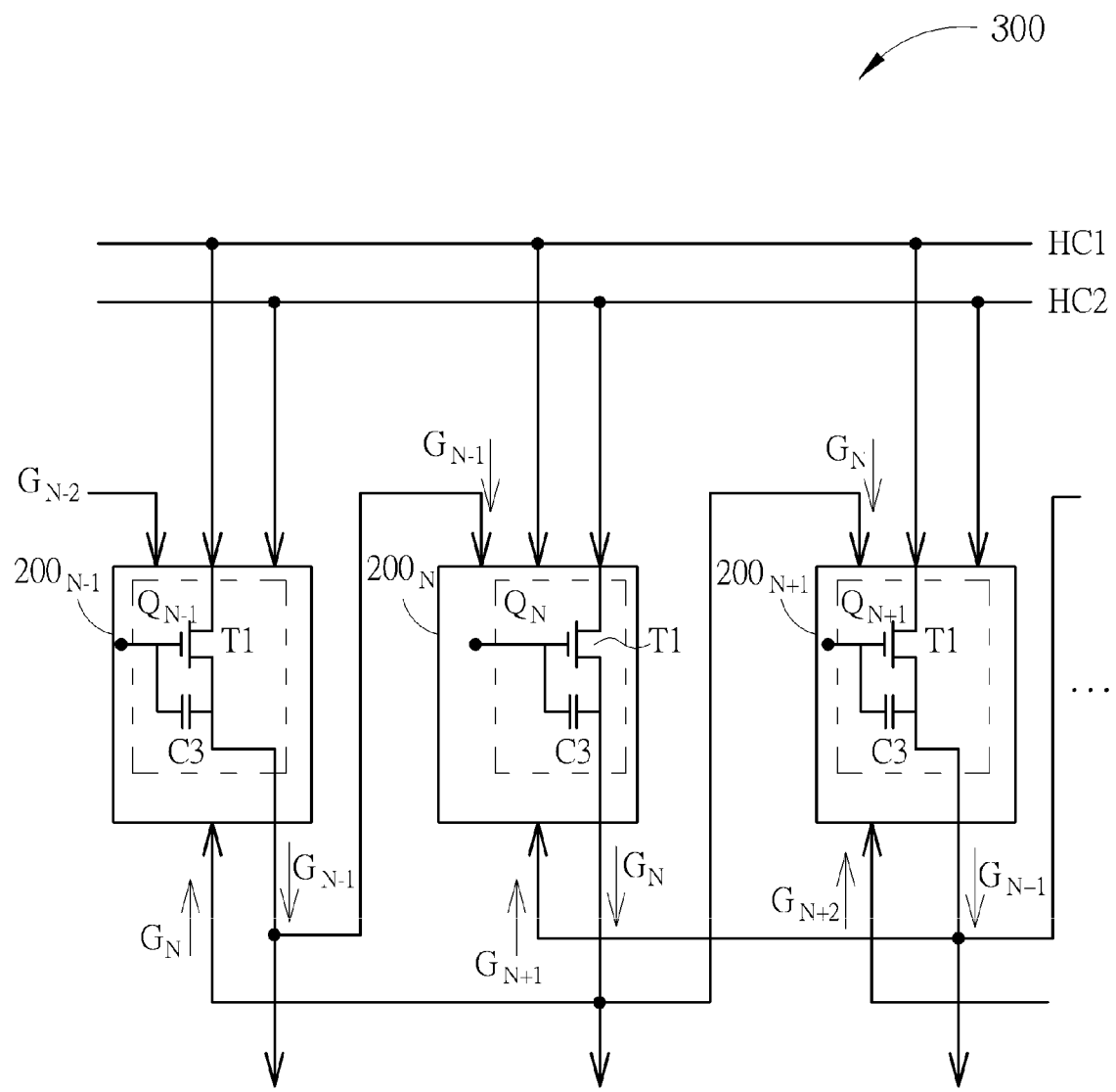
FIG. 3 shows a shift register according to one embodiment of the present disclosure.

FIG. 2 shows the shift register circuit $200_N$ according to one embodiment of the present disclosure. FIG. 3 shows the shift register 300 according to one embodiment of the present disclosure. The shift register 300 includes a plurality of stage of shift register circuits $200_{N-1}$, $200_N$ and $200_{N+1}$. N is a positive integer greater than 1 and each stage of the shift register circuit has the same structure.

The shift register circuit $200_N$ includes a first switch T1, an input circuit 210, a pull-down circuit 220 and a ripple reduction circuit 230. The first switch has a first terminal for receiving a first clock signal CK1, a second terminal for outputting a scan signal $G_N$ of the shift register circuit $200_N$, and a control terminal electrically coupled to a node $Q_N$ of the shift register circuit $200_N$. The input circuit 210 is used for pulling up a voltage level of the node $Q_N$ of the shift register circuit $200_N$ according to a scan signal $G_{N-1}$ of the shift register circuit $200_{N-1}$. The pull-down circuit 220 is electrically coupled to a second system voltage terminal V2, the node $Q_N$ of the shift register circuit $200_N$, and the second terminal of the first switch T1 for pulling down the voltage level of the node $Q_N$ of the shift register circuit $200_N$ and a voltage level of the second terminal of the first switch T1 according to a scan signal $G_{N+1}$ of the shift register circuit $200_{N+1}$. The ripple reduction circuit 230 is electrically coupled to the node $Q_N$ of the shift register circuit $200_N$ and a first system voltage terminal V1 for receiving a second clock signal CK2 and suppressing ripples on the node $Q_N$ of the shift register $200_N$ and ripples on the scan signal $G_N$ of the shift register circuit $200_N$ caused by the first clock CK1 coupling;

In FIG. 2, the ripple reduction circuit 230 of the shift register circuit $200_N$ includes a second switch T2, a third switch T3, a fourth switch T4, a first capacitor C1 and a second capacitor C2. The second switch T2 has a first terminal electrically coupled to the first system voltage terminal V1, a second terminal, and a control terminal for receiving the scan signal $G_{N+1}$ of the shift register circuit $200_{N+1}$ that is one stage after the shift register circuit $200_N$. The third switch T3 has a first terminal electrically coupled to the second terminal of the second switch T2, a second terminal electrically coupled to the second system voltage terminal V2, and a control terminal for receiving the scan signal $G_{N-1}$ of the shift register circuit $200_{N-1}$. The fourth switch T4 has a first terminal for receiving the second clock signal CK2, a control terminal electrically coupled to the second terminal of the second switch T2, and a second terminal. In other words, the control terminal of the fourth switch T4 is connected to the second terminal of the second switch T2 and the first terminal of the third switch T3. The first capacitor C1 has a first terminal electrically coupled to the second terminal of the second switch T2, and a second terminal electrically coupled to the second system voltage terminal V2. In other words, the first terminal of the first capacitor C1 is connected to the second terminal of the second switch T2, the control terminal of the fourth switch T4 and the first terminal of the third switch T3, and the second terminal of the first capacitor C1 is connected to the second system voltage terminal V2 and the second terminal of the third switch T3. The second capacitor C2 has a first terminal electrically coupled to the second terminal of the fourth switch T4, and a second terminal electrically coupled to the node $Q_N$ of the shift register circuit $200_N$.

In FIG. 2, the input circuit 210 of the shift register circuit $200_N$ includes a fifth switch T5. The fifth switch T5 has a first terminal for receiving the scan signal $G_{N-1}$ of the shift register $200_{N-1}$ that is one stage before the shift register circuit $200_N$, a second terminal electrically coupled to the node $Q_N$ of the shift register circuit $200_N$, and a control terminal electrically coupled to the first terminal of the fifth switch T5. The pull-down circuit 220 of the shift register circuit $200_N$ includes a sixth switch T6 and a seventh switch T7. The sixth switch T6 has a first terminal electrically coupled to the node $Q_N$ of the shift register circuit $200_N$, a second terminal electrically coupled to the second system voltage terminal V2, and a control terminal for receiving the scan signal $G_{N+1}$ of the shift register circuit $200_{N+1}$. The seventh switch T7 has a first terminal electrically coupled to the second terminal of the first switch T1, a second terminal electrically coupled to the second system voltage terminal V2, and a control terminal for receiving the scan signal $G_{N+1}$ of the shift register circuit $200_{N+1}$. The shift register circuit 200N further includes a third capacitor C3. The third capacitor C3 has a first terminal electrically coupled to the node $Q_N$ of the shift register circuit $200_N$, and a second terminal electrically coupled to the second terminal of the first switch T1. In other words, the node $Q_N$ of the shift register circuit $200_N$ is connected to the second terminal of the second capacitor C2, the control terminal of the first switch T1, the second terminal of the fifth switch T5, the first terminal of the sixth switch T6 and the first terminal of the third capacitor C3. The second terminal of the third capacitor C3 is connected to the second terminal of the first switch T1 and the first terminal of the seventh switch T7. The control terminal of the seventh switch T7 is connected to the control terminal of the sixth switch T6 and is adapted to receive the scan signal $G_{N+1}$ of the shift register circuit $200_{N+1}$.

In the embodiments of the present disclosure, the first switch T1 to the seventh switch T7 of the shift register circuit $200_N$ can all be N-type field effect transistors. In this case, the first system voltage terminal V1 can provide a gate high voltage VGH and the second system voltage terminal V2 can provide a gate low voltage VGL. Namely, the voltage level of the first system voltage terminal V1 can be higher than the voltage level of the second system voltage terminal V2. Also, the first switch T1 to the seventh switch T7 of the shift register circuit $200_N$ can be P-type field effect transistors. In this case, the first system voltage terminal V1 can provide the gate low voltage VGL and the second system voltage terminal V2 can provide the gate high voltage VGH. Namely, the voltage level of the first system voltage terminal V1 can be lower than the voltage level of the second system voltage terminal V2. For the convenience of explanation, the explanation below is based on the situation that the first to the seventh switches are of N-type field effect transistor. However, as mentioned, one can also use P-type field effect transistors to implement the first switch T1 to the seventh switch T7, and should still be considered as within the scope of the present disclosure.

The shift register 300 can be used as a gate driver of a display panel. The plurality of stages of the shift register circuit of the shift register 300 can be used to provide a plurality of gate driving signals to turn on and turn off the pixels of the display panel. In FIG. 3, each of the shift register circuits $200_{N-1}$ to $200_{N+1}$ can output a gate driving signal $G_{N-1}$ to $G_{N+1}$ to the corresponding gate line (also called scan line) in turn for turning on the corresponding row of pixels in the display panel. The shift register circuit $200_N$ and the shift register circuit $200_{N+1}$ receives the gate driving signal $G_{N-1}$ from the previous stage shift register circuit $200_{N-1}$ and the gate driving signal $G_N$ from the previous stage shift register circuit $200_N$ respectively. If the shift register circuit $200_{N-1}$ is the first stage of the shift register circuits, the shift register circuit $200_{N-1}$ will receive a first start signal; otherwise, the shift register circuit $200_{N-1}$ will receive a scan signal $G_{N-2}$ from the previous stage shift register circuit. In addition, the shift register circuit $200_{N-1}$ and the shift register circuit $200_N$ receives the scan signal $G_N$ from the next stage shift register circuit $200_N$ and the scan signal $G_{N+1}$ from the next stage shift register circuit $200_{N+1}$ respectively. If the shift register circuit $200_{N+1}$ is the last stage of the shift register circuits, the shift register circuit $200_{N+1}$ will receive a terminating signal, which may be generated by a dummy stage of shift register next to the shift register circuit $200_{N+1}$ in one embodiment of the present disclosure. Otherwise, the shift register circuit $200_{N+1}$ will receive a scan signal $G_{N+2}$ from a shift register circuit that is one stage after. In one embodiment of the present disclosure, the shift register circuit $200_{N-1}$ may output the gate driving signal $G_{N-1}$ firstly, and then the shift register circuits $200_N$ and $200_{N+1}$ can output the gate driving signal $G_N$ and $G_{N+1}$ in turn. That is, the shift register circuit $200_{N+1}$ is the last shift register circuit to output the driving signal $G_{+1}$ among the three shift register circuits $200_{N-1}$ to $200_{N+1}$. Furthermore, the shift register circuits $200_{N-1}$ and $200_{N+1}$ will use the clock signal HC1 as the first clock signal and use the clock signal HC2 as the second clock signal. The shift register circuit $200_N$ will use the clock signal HC2 as the first clock signal and use the clock signal HC1 as the second clock signal. The voltage levels of the clock signals HC1 and HC2 are switching between the gate high voltage VGH and the gate low voltage VGL. The voltage levels of the clock signals HC1 and HC2 are raised from the gate low voltage VGL to the gate high voltage VGH after each period of time. The clock signals HC1 and HC2 are changing to the gate high voltage VGH at different period of time. Namely, the clock signals HC1 and HC2 have the same period but opposite phases.

Figure 4:
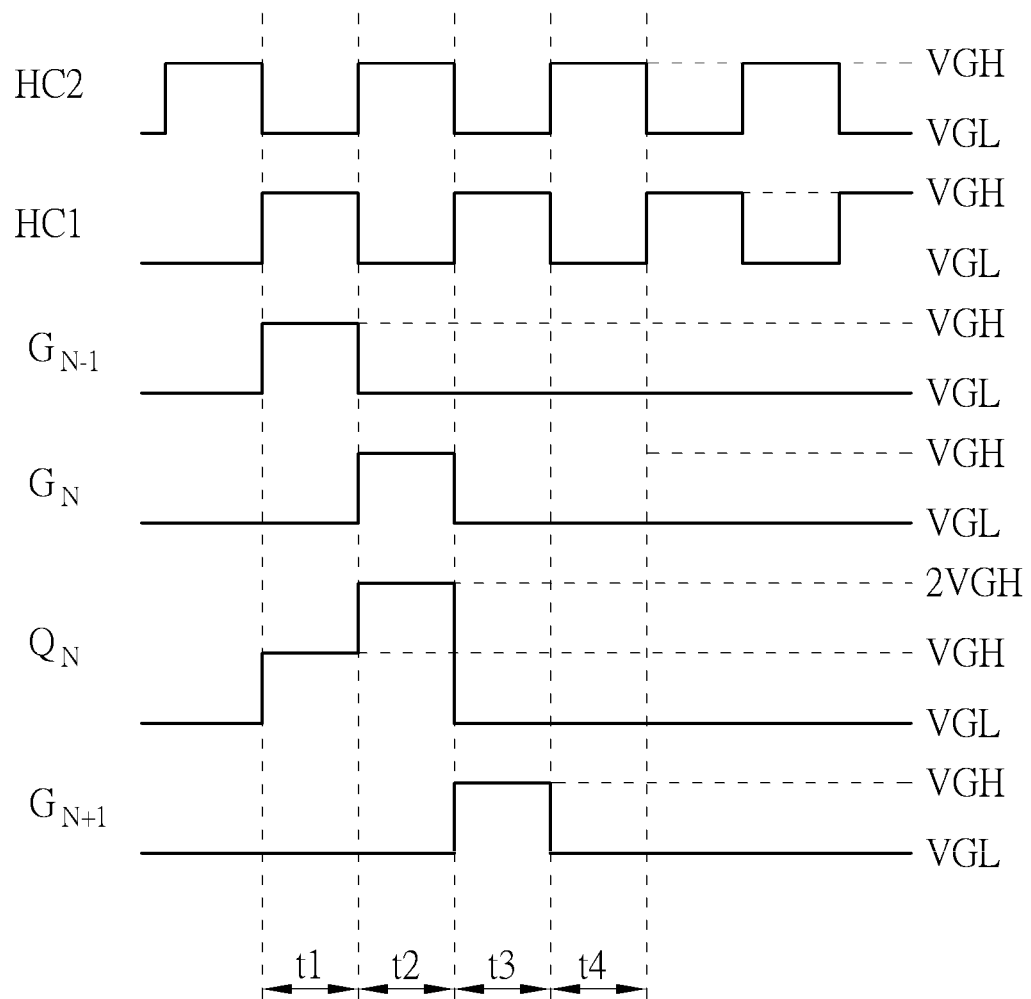
FIG. 4 shows a timing diagram of the shift register in FIG. 3.

FIG. 4 is the timing diagram of the shift register circuit 200N of the shift register 300 in FIG. 3. During the period of t1, the clock signal HC1 (the second clock signal CK2 received by the shift register circuit 200N) is of the gate high voltage VGH, the clock signal HC2 (the first clock signal CK1 received by the shift register circuit 200N) is of the gate low voltage VGL, the scan signal $G_{N-1}$ is of the gate high voltage VGH and the scan signal $G_{N+1}$ is at the gate low voltage VGL. The fifth switch T5 is turned on so the voltage level of the node $Q_N$ is pulled up to the gate high voltage VGH and the third capacitor C3 is charged, which turns on the first switch T1. The voltage level of the scan signal $G_N$ is kept at the gate low voltage VGL as the clock signal HC2. The sixth switch and the seventh switch are turned off. The second switch T2 is turned off, the third switch T3 is turned on so the first capacitor is discharged and the fourth switch T4 is turned off.

During the period of t2, the clock signal HC1 is of the gate low voltage VGL, the clock signal HC2 is of the gate high voltage VGH, the scan signal $G_{N-1}$ is of the gate low voltage VGL, and the scan signal $G_{N+1}$ is of the gate low voltage VGL. The fifth switch T5 is turned off. Since both the sixth and seventh switches T6 and T7 are also turned off, there is no discharging path for the node $Q_N$. Therefore, the first switch T1 is still turned on and the voltage level of the scan signal $G_N$ is pulled up to the gate high voltage VGH as the clock signal HC2. Also, due to the coupling effect of the third capacitor C3, the voltage level of the node $Q_N$ is pulled up to two times the gate high voltage VGH (that is 2VGH). The second switch T2, the third switch T3, and the fourth switch T4 are all turned off.

During the period of t3, the clock signal HC1 is of the gate high voltage VGH, the clock signal HC2 is of the gate low voltage VGL, the scan signal $G_{N-1}$ is of the gate low voltage VGL, and the scan signal $G_{N+1}$ is of the gate high voltage VGH. The fifth switch T5 is still turned off and both the sixth and the seventh switches T6 and T7 are turned on so the voltage level of the node $Q_N$ and the scan signal $G_N$ are pulled down to the gate low voltage VGL as the second system voltage terminal V2 and the first switch T1 is turned off. The second switch T2 is turned on and starts to charge the first capacitor C1. Thus, the fourth switch T4 is turned on and starts to charge the second capacitor C2. The third switch is turned off.

During the period of t4, the clock signal HC1 is of the gate low voltage VGL, clock signal HC2 is of the gate high voltage VGH, the scan signal $G_{N-1}$ is of the gate low voltage VGL, the scan signal $G_{N+1}$ is of the gate low voltage VGL. The second switch T2, the third switch T3, the fifth switch T5, the sixth switch T6 and the seventh switch T7 are all turned off. However, since the first capacitor C1 still preserves the charges stored during the period of t3, the fourth switch T4 is still turned on. Also, since the clock signal HC1 is of the gate low voltage VGL, the coupling effect on the node $Q_N$ caused by the first capacitor C1 can compensate the coupling effect on the node $Q_N$ caused by the parasitic capacitor of the first switch T1 so the first switch T1 can be avoided from turning on and outputting the scan signal $G_N$ wrongly by the ripples on the node $Q_N$.

According to the aforesaid embodiments, the ripple reduction circuit of the shift register circuit $200_N$ can protect the first switch T1 from turning on wrongly due to the ripples on the node $Q_N$ when the clock signal HC2 changes, and thus can preserve the correctness of waveform of the scan signal avoiding the wrong charging of the display panel.

Figure 5:
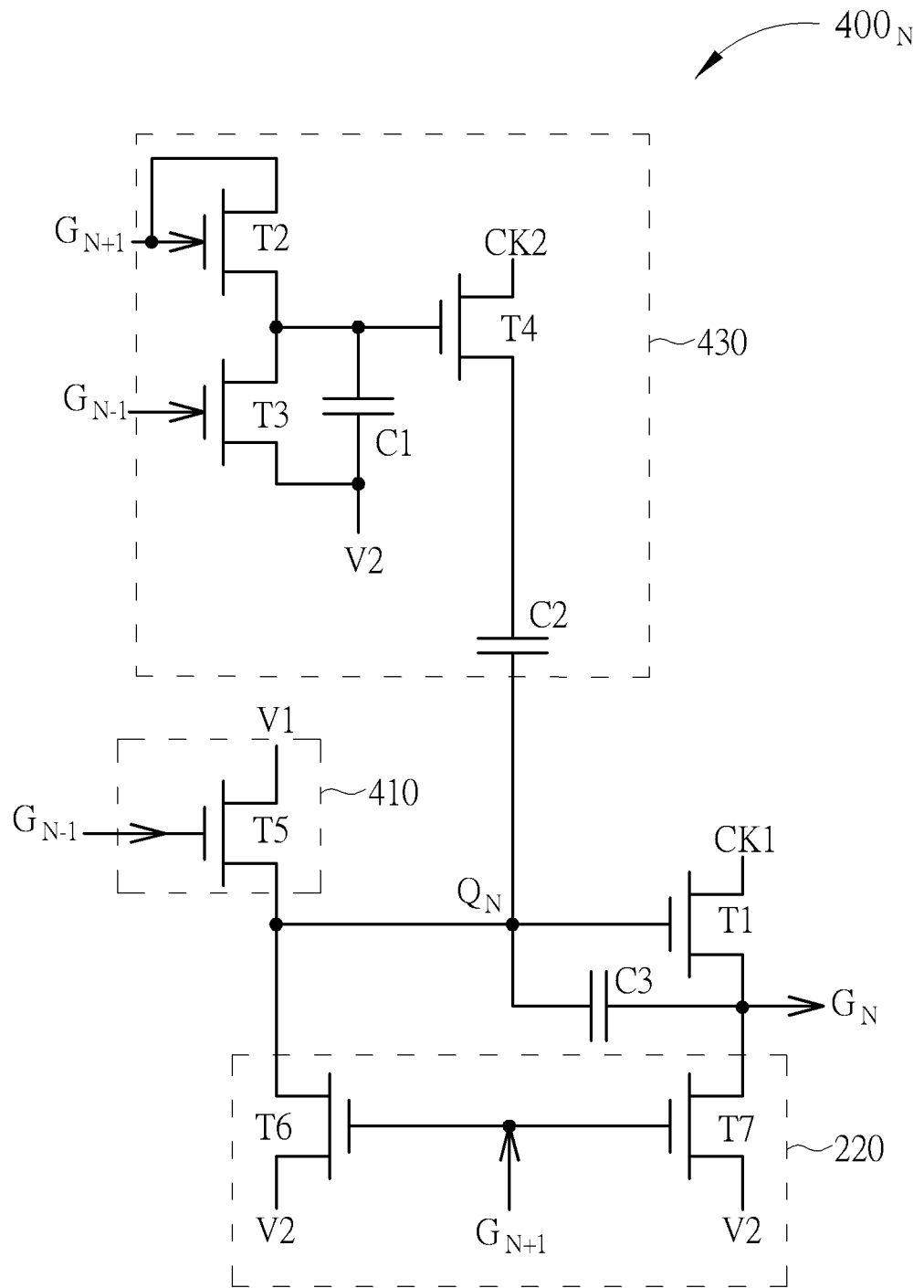
FIG. 5 shows a shift register circuit according to another embodiment of the present disclosure.

FIG. 5 shows the shift register circuit $400_N$ according to another embodiment of the present disclosure. The shift register circuit $400_N$ has the similar structure as the shift register circuit $200_N$. The difference between these two circuits is that both the first terminal and the control terminal of the second switch T2 of the ripple reduction circuit 430 of the shift register circuit $400_N$ are used for receiving the scan signal $G_{N+1}$ of the shift register that is one stage after, and the first terminal of the fifth switch T5 of the input circuit 410 of the shift register circuit $400_N$ is electrically coupled to the first system voltage terminal V1, and the control terminal of the fifth switch is used for receiving the scan signal $G_{N-1}$ of the shift register circuit that is one stage before. Since the second switch T2 and the fifth switch T5 of the shift register circuit $400_N$ are turned on and turned off during the same periods as the second switch T2 and the fifth switch T5 of the shift register circuit $200_N$, the shift register circuit $400_N$ is able to replace the shift register circuit $200_N$ in the shift register 300. Since the operations for the shift register circuit $400_N$ are the same as explained above for the shift register circuit $200_N$, the duplicated explanation is saved.

Figure 6:
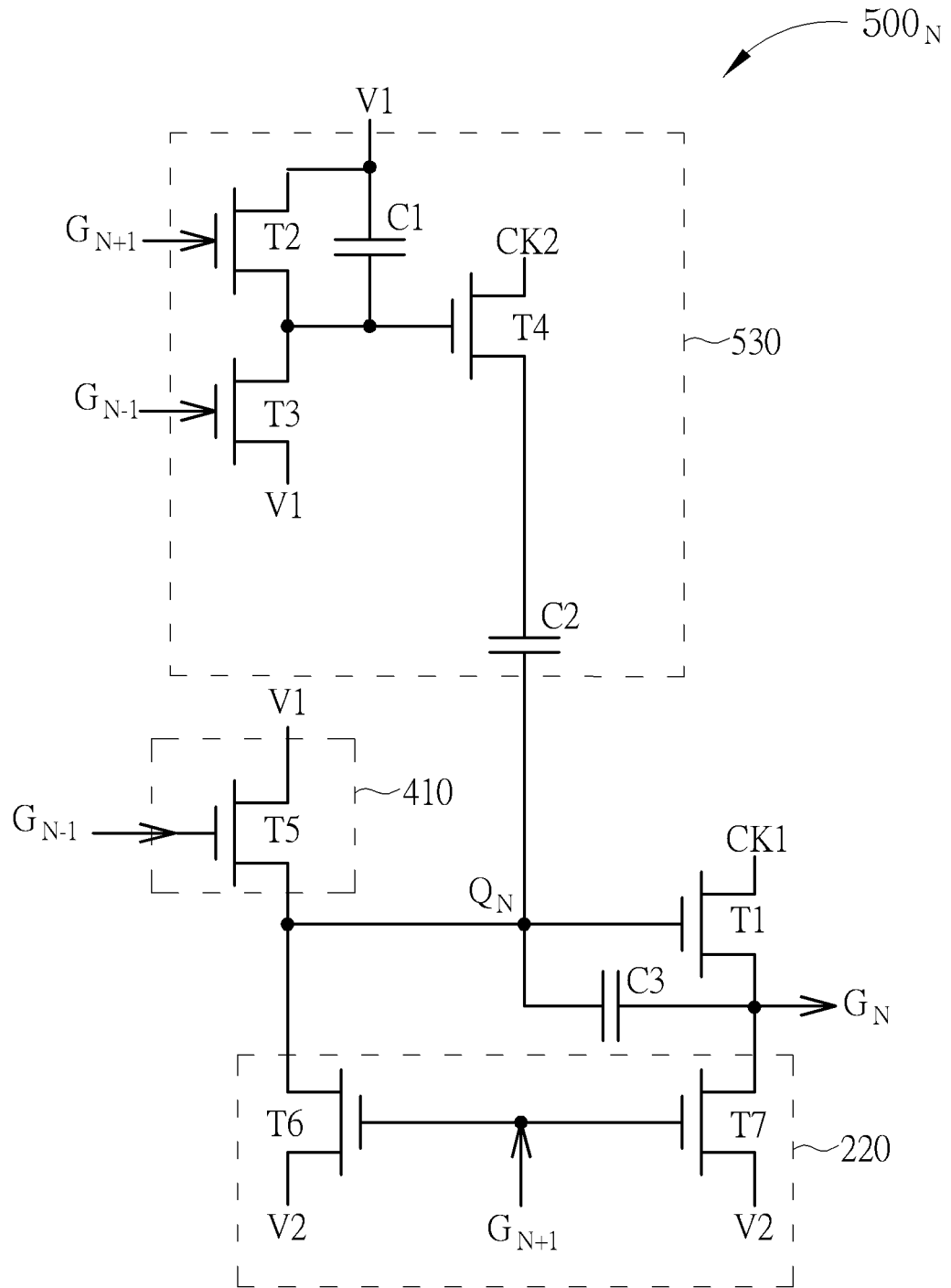
FIG. 6 shows a shift register circuit according to another embodiment of the present disclosure.

FIG. 6 shows the shift register circuit $500_N$ according to another embodiment of the present disclosure. The shift register circuit $500_N$ and the shift register circuit $200_N$ have the similar structures. The difference between these two circuits is that the second terminal of the first capacitor C1 of the ripple reduction circuit 530 is electrically coupled to the first system voltage terminal V1. In other words, the second terminal of the first capacitor C1 is connected to the first system voltage terminal V1 and the first terminal of the second switch T2. Furthermore, the first terminal of the fifth switch T5 is connected to the first system voltage terminal V1, and the control terminal of the fifth switch T5 is adapted to receive the scan signal $G_{N-1}$ of the shift register circuit that is one stage before. The shift register circuit $500_N$ can also be used as the shift register circuits in the shift register 300. Since the operations of the shift register circuit $500_N$ is similar to the operations of the shift register circuit $200_N$, the same FIG. 4 can also be used to explanation the operations as below.

During the period of t1, the clock signal HC1 (the second clock signal CK2 received by the shift register circuit $500_N$ in FIG. 6) is of the gate high voltage VGH, the clock signal HC2 (the first clock signal CK1 received by the shift register circuit $500_N$ in FIG. 6) is of the gate low voltage VGL, the scan signal $G_{N-1}$ is of the gate high voltage VGH and the scan signal $G_{N+1}$ is at the gate low voltage VGL. The fifth switch T5 is turned on so the voltage level of the node $Q_N$ is pulled up to the gate high voltage VGH and the third capacitor C3 is charged, which turns on the first switch T1. The voltage level of the scan signal $G_N$ is kept at the gate low voltage VGL as the clock signal HC2. The sixth switch T6 and the seventh switch T7 are turned off. The second switch T2 is turned off, the third switch T3 is turned on so the first terminal of the first capacitor C1 is of gate high voltage VGH and the second terminal of the first capacitor C1 is of the gate low voltage VGL, which turns off the fourth switch T4.

During the period of t2, the clock signal HC1 is of the gate low voltage VGL, the clock signal HC2 is of the gate high voltage VGH, the scan signal $G_{N-1}$ is of the gate low voltage VGL, and the scan signal $G_{N+1}$ is of the gate low voltage VGL. The fifth switch T5 is turned off. Since both the sixth and seventh switches T6 and T7 are also turned off, there is no discharging path for the node $Q_N$. Therefore, the first switch T1 is still turned on and the voltage level of the scan signal $G_N$ is pulled up to the gate high voltage VGH as the clock signal HC2. Also, due to the coupling effect of the third capacitor C3, the voltage level of the node $Q_N$ is pulled up to two times the gate high voltage VGH (that is 2VGH). The second switch T2, the third switch T3, and the fourth switch T4 are all turned off.

During the period of t3, the clock signal HC1 is of the gate high voltage VGH, the clock signal HC2 is of the gate low voltage VGL, the scan signal $G_{N-1}$ is of the gate low voltage VGL, and the scan signal $G_{N+1}$ is of the gate high voltage VGH. The fifth switch T5 is still turned off and both the sixth and the seventh switches T6 and T7 are turned on so the voltage level of the node $Q_N$ and the scan signal $G_N$ are pulled down to the gate low voltage VGL as the second system voltage terminal V2 and the first switch T1 is turned off. The second switch T2 is turned on so the second terminal of the first capacitor C1 is pulled up to the gate high voltage VGH. Thus, the fourth switch T4 is turned on and starts to charge the second capacitor C2. The third switch is turned off.

During the period of t4, the clock signal HC1 is of the gate low voltage VGL, clock signal HC2 is of the gate high voltage VGH, the scan signal $G_{N-1}$ is of the gate low voltage VGL, the scan signal $G_{N+1}$ is of the gate low voltage VGL. The second switch T2, the third switch T3, the fifth switch T5, the sixth switch T6 and the seventh switch T7 are all turned off. However, since there is no charge remaining in the first capacitor C1, the second terminal of the first capacitor C1 is kept at the gate high voltage VGH and the fourth switch T4 is still turned on. Also, since the clock signal HC1 is of the gate low voltage VGL, the coupling effect on the node $Q_N$ caused by the first capacitor C1 can compensate the coupling effect on the node $Q_N$ caused by the parasitic capacitor of the first switch T1 so the first switch T1 can be avoided from turning on and outputting the scan signal $G_N$ wrongly by the ripples on the node $Q_N$.

According to the aforesaid embodiments, the ripple reduction circuit of the shift register circuit $500_N$ can protect the first switch T1 from turning on wrongly due to the ripples on the node $Q_N$, and thus can preserve the correctness of waveform of the scan signal $G_N$ outputted by the shift register 300 avoiding the wrong charging of the display panel.

In summary, the shift register proposed by the embodiments of the present disclosure can avoid the switch from turning on and outputting the scan signal mistakenly caused by the coupling effect of the clock signal and the ripples on the internal node. Therefore, the correctness of waveform of the scan signal GN can be preserved, which avoids the wrong charging of the display panel.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A shift register comprising a plurality of stages of shift register circuit, wherein each stage of shift register circuit comprises:
   a first switch having a first terminal for receiving a first clock signal, a second terminal for outputting a scan signal of a current stage of shift register circuit, and a control terminal electrically coupled to a node of the current stage of shift register circuit;
   an input circuit for pulling up a voltage level of the node of the shift register circuit according to a scan signal of a shift register circuit that is one stage before the current stage of shift register circuit;
   a pull-down circuit electrically coupled to a second system voltage terminal, the node of the current stage of shift register circuit and the second terminal of the first switch, the pull-down circuit for pulling down the voltage level of the node of the current stage of shift register circuit and a voltage level of the second terminal of the first switch according to a scan signal of a shift register circuit that is one stage after the current stage of shift register circuit; and
   a ripple reduction circuit electrically coupled to the node of the current stage of shift register circuit and a first system voltage terminal, the ripple reduction circuit for receiving a second clock signal and suppressing ripples on the node of the current stage of shift register circuit and ripples on the scan signal of the current stage of shift register circuit caused by the first clock coupling, the ripple reduction circuit comprising:
      a second switch having a first terminal electrically coupled to the first system voltage terminal, a second terminal, and a control terminal for receiving the scan signal of the shift register circuit that is one stage after the current stage of shift register circuit;
      a third switch having a first terminal electrically coupled to the second terminal of the second switch, a second terminal electrically coupled to the second system voltage terminal, and a control terminal for receiving the scan signal of the shift register circuit that is one stage before the current stage of shift register circuit;
      a fourth switch having a first terminal for receiving the second clock signal, a second terminal, and a control terminal electrically coupled to the second terminal of the second switch;
      a first capacitor having a first terminal electrically coupled to the second terminal of the second switch and a second terminal; and
      a second capacitor having a first terminal electrically coupled to the second terminal of the fourth switch, and a second terminal electrically coupled to the node of the current stage of shift register circuit;
   wherein the first clock signal and the second clock signal have a same period but opposite phases.

2. The shift register of claim 1, wherein the second terminal of the first capacitor is electrically coupled to the first system voltage terminal or the second system voltage terminal.

3. The shift register of claim 1, wherein the input circuit comprises:
   a fifth switch having a first terminal for receiving the scan signal of the shift register circuit that is one stage before the current stage of shift register circuit, a second terminal electrically coupled to the node of the current stage of shift register circuit, and a control terminal electrically coupled to the first terminal of the fifth switch.

4. The shift register of claim 1, wherein the input circuit comprises:
   a fifth switch having a first terminal electrically coupled to the first system voltage terminal, a second terminal electrically coupled to the node of the current stage of shift register circuit, and a control terminal for receiving the scan signal of the shift register circuit that is one stage before the current stage of shift register circuit.

5. The shift register of claim 1, wherein the pull-down circuit comprises:
a sixth switch having a first terminal electrically coupled to the node of the current stage of shift register circuit, a second terminal electrically coupled to the second system voltage terminal, and a control terminal for receiving the scan signal of the shift register circuit that is one stage after the current stage of shift register circuit; and
a seventh switch having a first terminal electrically coupled to the second terminal of the first switch, a second terminal electrically coupled to the second system voltage terminal, and a control terminal for receiving the scan signal of the shift register circuit that is one stage after the current stage of shift register circuit.

6. The shift register of claim 1, each of the shift register circuit further comprising:
a third capacitor having a first terminal electrically coupled to the node of the current stage of shift register circuit, and a second terminal electrically coupled to the second terminal of the first switch.

7. The shift register of claim 1, wherein the switches of the shift register are N-type field effect transistors and a voltage level of the first system voltage terminal is higher than a voltage level of the second system voltage terminal.

8. The shift register of claim 1, wherein the switches of the shift register are P-type field effect transistors and a voltage level of the first system voltage terminal is lower than a voltage level of the second system voltage terminal.

9. A shift register comprising a plurality of stages of shift register circuit, wherein each stage of shift register circuit comprises:
a first switch having a first terminal for receiving a first clock signal, a second terminal for outputting a scan signal of a current stage of shift register circuit, and a control terminal electrically coupled to a node of the current stage of shift register circuit;
an input circuit for pulling up a voltage level of the node of the shift register circuit according to a scan signal of a shift register circuit that is one stage before the current stage of shift register circuit;
a pull-down circuit electrically coupled to a second system voltage terminal, the node of the current stage of shift register circuit and the second terminal of the first switch, the pull-down circuit for pulling down the voltage level of the node of the current stage of shift register circuit and a voltage level of the second terminal of the first switch according to a scan signal of a shift register circuit that is one stage after the current stage of shift register circuit; and
a ripple reduction circuit electrically coupled to the node of the current stage of shift register circuit and a first system voltage terminal, the ripple reduction circuit for receiving a second clock signal and suppressing ripples on the node of the current stage of shift register circuit and ripples on the scan signal of the current stage of shift register circuit caused by the first clock coupling, the ripple reduction circuit comprising:
a second switch having a first terminal for receiving the scan signal of the shift register circuit that is one stage after the current stage of shift register circuit, a second terminal, and a control terminal for receiving the scan signal of the shift register circuit that is one stage after the current stage of shift register circuit;
a third switch having a first terminal electrically coupled to the second terminal of the second switch, a second terminal electrically coupled to the second system voltage terminal, and a control terminal for receiving the scan signal of the shift register circuit that is one stage before the current stage of shift register circuit;
a fourth switch having a first terminal for receiving the second clock signal, a second terminal, and a control terminal electrically coupled to the second terminal of the second switch;
a first capacitor having a first terminal electrically coupled to the second terminal of the second switch and a second terminal; and
a second capacitor having a first terminal electrically coupled to the second terminal of the fourth switch, and a second terminal electrically coupled to the node of the current stage of shift register circuit,
wherein the first clock signal and the second clock signal have a same period but opposite phases.

10. The shift register of claim 9, wherein the second terminal of the first capacitor is electrically coupled to the first system voltage terminal or the second system voltage terminal.

11. The shift register of claim 9, wherein the input circuit comprises:
a fifth switch having a first terminal for receiving the scan signal of the shift register circuit that is one stage before the current stage of shift register circuit, a second terminal electrically coupled to the node of the current stage of shift register circuit, and a control terminal electrically coupled to the first terminal of the fifth switch.

12. The shift register of claim 9, wherein the input circuit comprises:
a fifth switch having a first terminal electrically coupled to the first system voltage terminal, a second terminal electrically coupled to the node of the current stage of shift register circuit, and a control terminal for receiving the scan signal of the shift register circuit that is one stage before the current stage of shift register circuit.

13. The shift register of claim 9, wherein the pull-down circuit comprises:
a sixth switch having a first terminal electrically coupled to the node of the current stage of shift register circuit, a second terminal electrically coupled to the second system voltage terminal, and a control terminal for receiving the scan signal of the shift register circuit that is one stage after the current stage of shift register circuit; and
a seventh switch having a first terminal electrically coupled to the second terminal of the first switch, a second terminal electrically coupled to the second system voltage terminal, and a control terminal for receiving the scan signal of the shift register circuit that is one stage after the current stage of shift register circuit.

14. The shift register of claim 9, each of the shift register circuit further comprising:
a third capacitor having a first terminal electrically coupled to the node of the current stage of shift register circuit, and a second terminal electrically coupled to the second terminal of the first switch.

15. The shift register of claim 9, wherein the switches of the shift register are N-type field effect transistors and a voltage level of the first system voltage terminal is higher than a voltage level of the second system voltage terminal.

16. The shift register of claim 9, wherein the switches of the shift register are P-type field effect transistors and a voltage level of the first system voltage terminal is lower than a voltage level of the second system voltage terminal.

* * * * *